US008987976B2

(12) United States Patent
Zuo et al.

(10) Patent No.: US 8,987,976 B2
(45) Date of Patent: Mar. 24, 2015

(54) PIEZOELECTRIC RESONATOR HAVING COMBINED THICKNESS AND WIDTH VIBRATIONAL MODES

(75) Inventors: Chengjie Zuo, San Diego, CA (US); Chi Shun Lo, San Diego, CA (US); Sanghoon Joo, San Diego, CA (US); Changhan Yun, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 613 days.

(21) Appl. No.: 13/241,356

(22) Filed: Sep. 23, 2011

(65) Prior Publication Data

US 2013/0076209 A1 Mar. 28, 2013

(51) Int. Cl.
*H01L 41/047* (2006.01)
*H03H 9/02* (2006.01)
*H03H 9/56* (2006.01)

(52) U.S. Cl.
CPC ....... *H03H 9/02157* (2013.01); *H03H 9/02062* (2013.01); *H03H 9/56* (2013.01)
USPC ............................. 310/366; 310/317; 310/328

(58) Field of Classification Search
USPC ........................ 310/316.01, 316.02, 317, 318, 310/319–321, 328, 366–369
See application file for complete search history.

(56) References Cited

U.S. PATENT DOCUMENTS

| | | | | |
|---|---|---|---|---|
| 2,540,187 A | * | 2/1951 | Cherry, Jr. | 310/358 |
| 2,540,194 A | * | 2/1951 | Ellett | 310/331 |
| 2,836,737 A | * | 5/1958 | Crownover | 310/331 |
| 3,531,742 A | * | 9/1970 | Futami et al. | 333/187 |
| 4,101,795 A | * | 7/1978 | Fukumoto et al. | 310/336 |
| 4,360,754 A | * | 11/1982 | Toyoshima et al. | 310/366 |
| 4,603,276 A | * | 7/1986 | Coursant | 310/368 |
| 5,118,982 A | | 6/1992 | Inoue et al. | |
| 5,771,555 A | * | 6/1998 | Eda et al. | 29/25.35 |
| 6,049,157 A | * | 4/2000 | Kobayashi | 310/316.01 |
| 6,051,916 A | | 4/2000 | Kaida et al. | |

(Continued)

FOREIGN PATENT DOCUMENTS

| | | | |
|---|---|---|---|
| EP | 1887690 A2 | 2/2008 | |
| JP | 56-141700 A | * 11/1981 | H04R 17/00 |

(Continued)

OTHER PUBLICATIONS

International Search Report and Written Opinion—PCT/US2012/056962—ISA/EPO—Dec. 21, 2012.
Piazza G., et al., "One and two port piezoelectric higher order contour-mode MEMS resonators for mechanical signal processing", Solid State Electronics, Elsevier Science Publishers, Barking, GB, vol. 51, No. 11-12, Nov. 19, 2007, pp. 1596-1608, XP022360463, ISSN: 0038-1101, DOI: 10.1016/J.SSE.2007.09.037.

*Primary Examiner* — Thomas Dougherty
(74) *Attorney, Agent, or Firm* — Donald D. Min

(57) ABSTRACT

A method and apparatus for a piezoelectric resonator having combined thickness and width vibrational modes are disclosed. A piezoelectric resonator may include a piezoelectric substrate and a first electrode coupled to a first surface of the piezoelectric substrate. The piezoelectric resonator may further include a second electrode coupled to a second surface of the piezoelectric substrate, where the first surface and the second surface are substantially parallel and define a thickness dimension of the piezoelectric substrate. Furthermore, the thickness dimension and the width dimension of the piezoelectric substrate are configured to produce a resonance from a coherent combination of a thickness vibrational mode and a width vibrational mode when an excitation signal is applied to the electrodes.

18 Claims, 6 Drawing Sheets

(56) References Cited

U.S. PATENT DOCUMENTS

| | | |
|---|---|---|
| 6,054,797 A | 4/2000 | Wajima et al. |
| 6,118,206 A * | 9/2000 | Toda ............................ 310/318 |
| 6,144,141 A | 11/2000 | Unami et al. |
| 7,176,770 B2 | 2/2007 | Ayazi et al. |
| 7,795,998 B2 | 9/2010 | Mayer et al. |
| 8,058,768 B2 * | 11/2011 | Milsom et al. ............ 310/313 R |
| 2004/0232803 A1 * | 11/2004 | Matsushita et al. ........... 310/358 |
| 2007/0252485 A1 | 11/2007 | Kawakubo et al. |
| 2007/0267947 A1 * | 11/2007 | Matsushita et al. ........... 310/358 |

FOREIGN PATENT DOCUMENTS

| | | | | |
|---|---|---|---|---|
| JP | 11-201758 A | * | 7/1999 | ............... G01P 9/04 |
| JP | 1 349 220 A2 | * | 10/2003 | ............. H01L 41/18 |

\* cited by examiner

PIEZOELECTRIC RESONATOR HAVING COMBINED THICKNESS AND WIDTH VIBRATIONAL MODES

FIELD OF DISCLOSURE

Disclosed embodiments are related to piezoelectric resonators, and more particularly, to piezoelectric resonators which combine thickness and width vibrational modes to improve electromechanical coupling.

BACKGROUND

Piezoelectric resonators may be used in various components such as oscillators and filters over a wide range of frequency applications. These resonators may also be employed in generating clock signals in integrated circuits, where the frequency of vibration is directly related to a clock frequency.

Piezoelectric resonators may be thought of as solid state transducers which can convert mechanical energy into electrical energy and electrical energy back into mechanical energy, depending upon how the resonators are configured. The mechanical energy manifests itself as vibrations within the piezoelectric material of the resonator.

FIGS. 1A and 1B show different modes of resonance in conventional piezoelectric resonators. The various modes of resonance may be defined relative to the geometry of the piezoelectric material producing the vibrations. In FIG. 1A, piezoelectric resonator 100 may include a piezoelectric substrate 115 having a first electrode 105 coupled to its upper surface, and a second electrode 110 coupled to its lower surface. When an electric excitation signal is applied to the electrodes 105 and 110, an electric field 120 may be induced within the piezoelectric substrate 115. The electric field 120 may cause a width vibrational mode 125, where the frequency of vibration may depend upon the width of the piezoelectric substrate (W). The width vibrational mode may also be referred to as a "d31" vibration, where d31 is a piezoelectric coefficient related to the width dimension (i.e., lateral dimension as shown in FIG. 1A) of the piezoelectric substrate 115.

As shown in FIG. 1B, the same electric field 120 may also cause a thickness vibrational mode 130 in the piezoelectric substrate 115. Here the frequency of vibration may depend upon the thickness of the piezoelectric substrate (T). The thickness vibrational mode may also be referred to as a "d33" vibration, where d33 is a piezoelectric coefficient related to the thickness dimension (i.e., vertical dimension as shown in FIG. 1B) of the piezoelectric substrate 115.

A coefficient of electromechanical coupling, denoted by $k_t^2$, represents the efficiency of energy conversion, such that a higher coefficient of electromechanical coupling indicates that mechanical energy is more efficiently converted to electrical energy.

In practice, thickness vibrational modes are commonly exploited in piezoelectric resonators because this mode tends to exhibit a high coefficient of electromechanical coupling, $k_t^2$. However, resonators utilizing thickness-only vibrational modes suffer from the drawback that T may not provide the freedom to define the resonant frequency by layout design, which is an advantage of resonators having width-only vibrational modes. It should be noted that the layout design is a pre-fabrication process, which cannot be altered after fabrication. In other words, by doing only one fabrication run, the width vibrational modes may provide multiple frequencies of operation on a single wafer, but the thickness vibrational mode resonators only provide one frequency.

On the other hand, width vibrational mode piezoelectric resonators having substrates made from Aluminum Nitride exhibit a coefficient of electromechanical coupling that is nearly one third the value associated with thickness vibrational mode resonators. This means that efficiency of width vibration mode resonators may be low. However, the width may be easily alterable during a pre-fabrication design process by coupling multiple vibrational resonators to form a multi-finger resonator. The multiple fingers may be adjacently placed and mechanically coupled by their edges so that the entire structure, including multiple fingers, vibrates as a single body. The multiple fingers may be electrically connected in parallel so that the entire structure is electrically equivalent to a single resonator.

There are currently no piezoelectric resonators which can take advantage of the positive attributes of both the width and thickness vibrational modes. Accordingly, there is a need for piezoelectric resonators which can combine the advantages of width and thickness vibrational modes to improve efficiency, while still preserving the single-chip (i.e., single-fabrication) multiple frequency capability.

SUMMARY

The disclosed embodiments are directed to piezoelectric resonators having combined thickness and width vibrational modes.

One embodiment can comprise a piezoelectric resonator, which may include a piezoelectric substrate and a first electrode coupled to a first surface of the piezoelectric substrate. The piezoelectric resonator may further include a second electrode coupled to a second surface of the piezoelectric substrate, wherein the first surface and the second surface are substantially parallel and define a thickness dimension of the piezoelectric substrate, and further where the thickness dimension and a width dimension of the piezoelectric substrate are configured to produce a resonance from a coherent combination of a thickness vibrational mode and a width vibrational mode when an excitation signal is applied to the electrodes.

Another embodiment may include a method for generating an oscillating signal in a piezoelectric resonator. The method may include receiving an electric signal across a piezoelectric element, and establishing a first vibrational mode in a thickness dimension of the piezoelectric element. The method may further include establishing a second vibrational mode in a width dimension of the piezoelectric element, and combining coherently the first vibration mode and the second vibration mode to produce a resonant vibration which increases a coefficient of electromechanical coupling ($k_t^2$) beyond a width-only vibration mode while providing single-chip multiple frequency capability.

Another embodiment may include a piezoelectric resonator having resonations in a vertical direction, and resonations in a lateral direction. The resonations in the vertical direction and the resonations in the lateral direction may be combined to generate electrical signals.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Figure 1A:
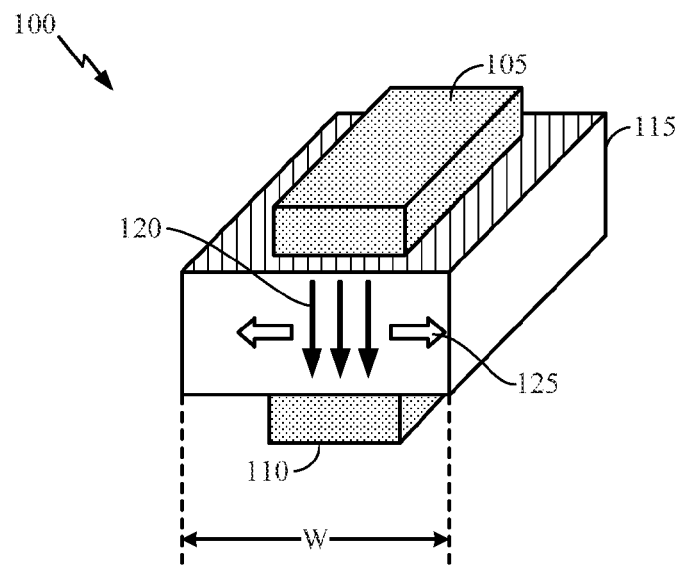
FIGS. 1A and 1B show diagrams of conventional piezoelectric resonators showing different vibrational modes.
Figure 1B:
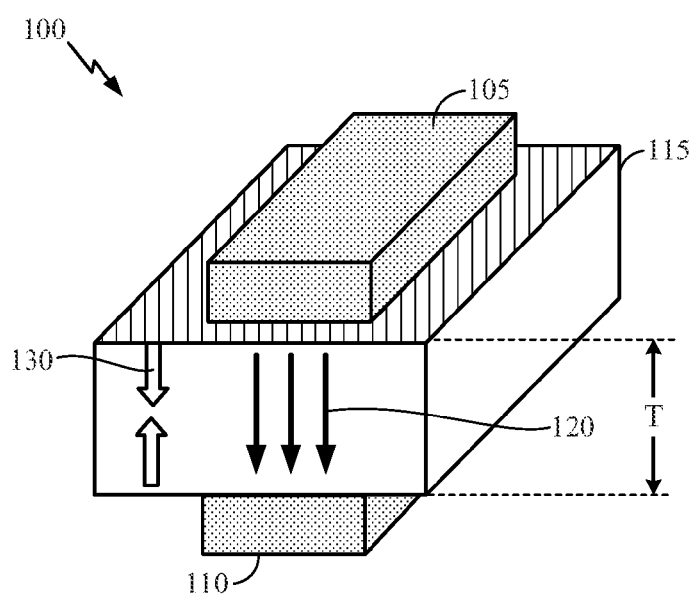

Aspects of the embodiments are disclosed in the following description and related drawings directed to such embodiments. Alternate embodiments may be devised without departing from the scope of the invention. Additionally, well-known elements used and applied in the embodiments will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Embodiments provided herein discuss piezoelectric resonators having combined width and thickness vibrational modes using a common excitation signal. As used herein, width vibrational modes, which may also be referred to as lateral vibration modes, may be defined as the dimension of vibration which is perpendicular to the applied electric field. The thickness vibrational mode, which may also be referred to as the vertical vibration mode, may be defined as the dimension of vibration which is parallel to the applied electric field. Electrical energy generated from the vibrations in both width and thickness may be harnessed to increase efficiency and maximize the electromechanical coupling. It is observed through experimentation that a thickness to width ratio (T/W) of approximately 1 (i.e. width is approximately equal to thickness) provide improved efficiency, as will be discussed in more detail below. The piezoelectric resonators may be fabricated using known techniques and embodied in at least one semiconductor die.

Figure 2:
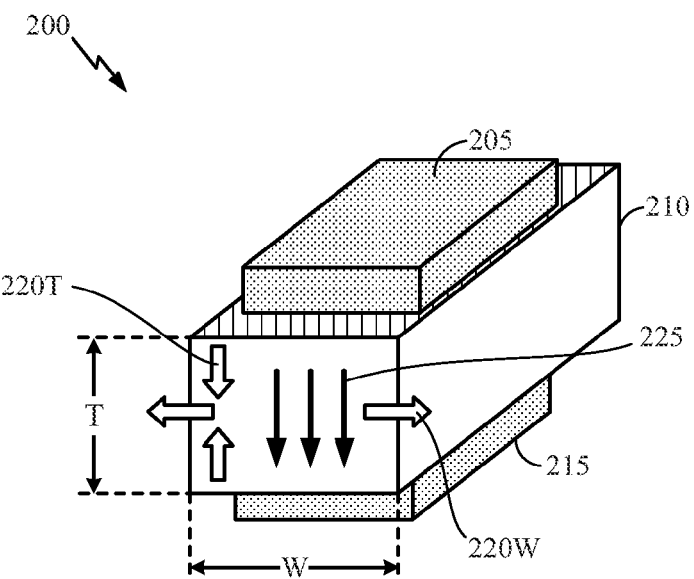
FIG. 2 illustrates a diagram of an exemplary single piezoelectric resonator having combined width and thickness vibrational modes.

FIG. 2 illustrates a diagram of an exemplary single piezoelectric resonator 200 having combined width and thickness vibrational modes. The piezoelectric resonator 200 may have a first electrode 205 and a second electrode 215, both of which may be coupled to a piezoelectric substrate 210 on the opposing side thereof. However, in some embodiments, the electrical signal may be applied directly to the piezoelectric substrate without the use of fabricated electrodes 205, 215.

The piezoelectric substrate 210 may typically be formed using Aluminum Nitride (AlN), Zinc Oxide (ZnO), or any other suitable material having piezoelectric properties. The ratio of the width to the thickness (T/W) may lie in the range between 0.75 and 1.25, and may be, for example, one. When T/W is equal to one, the thickness and width extents are the same and the piezoelectric substrate 210 has a square cross-section. When T/W=1, the combined frequency of vibration inversely depends upon the dimensions. That is, $T=W=\lambda/2$, where $\lambda$ corresponds to the wavelength of the resonant vibration. The frequency may be determined by $f=v/\lambda$, where v is the velocity of propagation of the vibrational wave through the piezoelectric substrate 210. The velocity of propagation v is the acoustic velocity of the wave which travels in the piezoelectric substrate 210.

When an electric excitation signal is applied to electrodes 205 and 215, an electric field 225 may be formed in the piezoelectric substrate 210. The electric field 225 excites the piezoelectric substrate 210 and induces vibrations in the width (W) extent (i.e., excites a width vibrational mode 220W) and induces vibrations in the thickness (T) extent (i.e., excites a thickness vibrational mode 220T). The two vibrational modes occur simultaneously and can combine in a coherent manner within the piezoelectric substrate 210, thus producing a combined vibrational mode which is more efficient than a width-only vibrational mode component. The two vibrational modes manifest mechanical energy which may be converted back into an electrical signal.

The coherent combination of the two modes of vibration may result in a higher effective electromechanical coupling $k_t^2$ (wherein $k_t^2$ is the ratio of the mechanical energy to the electrical energy) than the width-only vibrational mode. Accordingly, this technique provides a way to optimize the $k_t^2$ of laterally vibrating (width vibrational mode) resonators by engineering the piezoelectric thin film thickness, so that both high $k_t^2$ and single-chip multiple frequency capability can be achieved simultaneously in a single device technology. One should appreciate that the T/W ratio doesn't have to be exactly equal to 1 to achieve this goal, but should be close to 1 for improved $k_t^2$ results.

Piezoelectric resonator 200 as shown in FIG. 2 is a finger resonator, where the first electrode 205 may serve as the input, and the second electrode 215 may serve as the output electrode or as ground. For example, if the second electrode 215 is grounded, the resonator is a one-port resonator, which is a two-terminal device. If the second electrode is output, the resonator is a two-port resonator, which is a four-terminal device.

According to one embodiment, the piezoelectric resonator 200 may include a means (205, 215) for receiving an electric signal across a piezoelectric element, a means (210) for establishing a first vibrational mode in a width direction, a means (210) for establishing a second vibrational mode a thickness direction, and a means (210) for combining the first vibration mode and the second vibration mode to produce a resonant vibration which increases a coefficient of electromechanical coupling ($k_t^2$) beyond a width-only vibration mode.

Accordingly, another embodiment may include a piezoelectric resonator 200 having resonations in a vertical direction, and resonations in a lateral direction. The resonations in the vertical direction and the resonations in the lateral direction may be combined in the piezoelectric substrate 210 to generate electrical signals.

Figure 3:
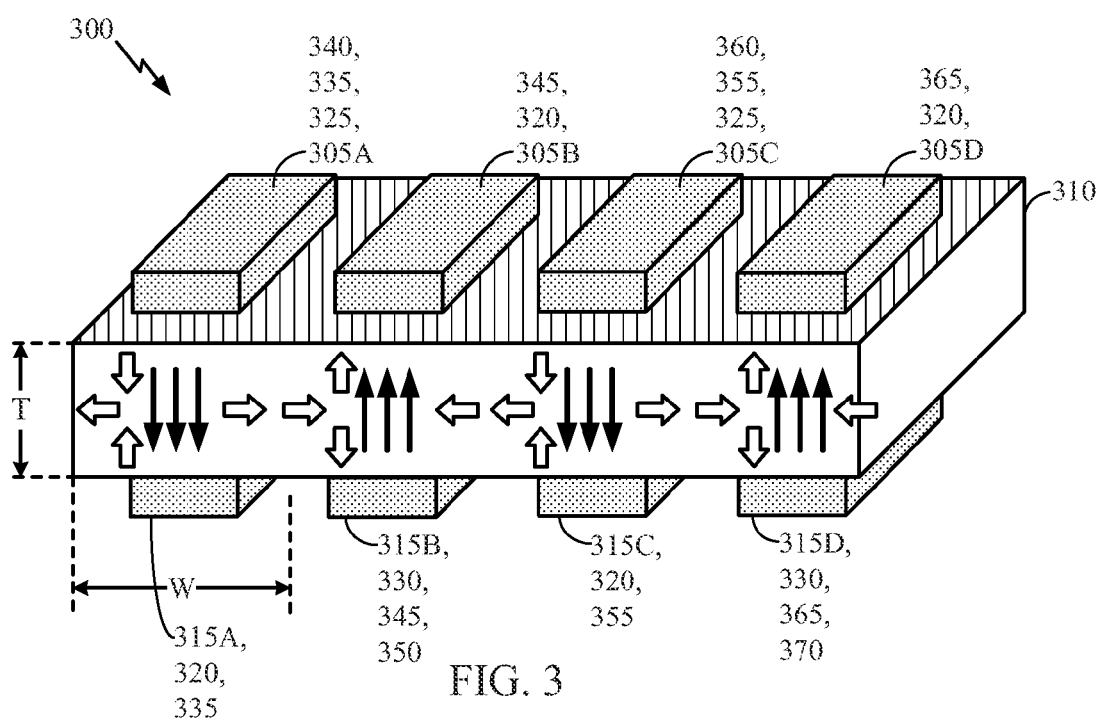
FIG. 3 is a diagram showing an exemplary multi-finger piezoelectric resonator having combined width and thickness vibrational modes.

FIG. 3 is a diagram showing an exemplary multi-finger piezoelectric resonator 300 having combined width and thickness vibrational modes. The piezoelectric resonator 300 includes an extended piezoelectric substrate 310. A first set of electrodes 305A-305D are coupled to a first surface of the extended piezoelectric substrate 310, and a second set of electrodes 315A-315D are coupled to second side of the extended piezoelectric substrate 310. The second side may be opposite and/or parallel to the first side.

The multi-finger piezoelectric resonator 300 includes an integer number (N) of sub-resonators. Each sub-resonator may have a width dimension of W and a thickness dimension of T. The ratio T/W may lie in the range of 0.75 to 1.25, and, for example, may be equal to 1. Accordingly, the entire extent in the width dimension of the piezoelectric substrate 310 is approximately N×W. The opposing pairs of electrodes (e.g., 305A, 315A) disposed across each sub-resonator. Both sets of electrodes 305, 315 may be equally spaced in the width dimension along the extended piezoelectric substrate 310, separated by a pitch value proportional to W.

The multi-finger piezoelectric resonator 300 may be a multi-port resonator. Each port may include two terminals. Generally one of the two terminals is typically; ground 320; however, this does not necessarily have to be the case. In one example, where the resonator 300 may utilize a two-port electrode configuration, the electrodes 305A and 305C can form the input, terminal 325, while 315B and 315D may form the output terminal 330. The remaining electrodes may form the ground terminal 320 and be shared by both the input and output ports. The input terminal 325 and ground terminal 320 (two terminals) form the input port. The output terminal 330 and ground terminal 320 form the output port.

In another example, the multi-finger piezoelectric resonator 300 may utilize a four-port electrode configuration which can be used to support differential input and differential output. The ground terminal 320 can be shared by the four terminals to form the four ports: port 1 335: input+ 340 and ground 320; port 2 345: input− 350 and ground 320; port 3 355: output+ 360 and; ground 320; port 4 365: output− 370 and ground 320.

Because the adjacent sub-resonators generally vibrate out-of-phase with respect to each other, the electrical field lines have an alternating pattern for different sub-resonators. This phasing arrangement permits the design of the equivalent impedance of the entire multi-finger piezoelectric resonator. The $k_t^2$ is improved by engineering the W/T ratio, but may have little to do with the multiple finger arrangement, having some electrodes dedicated to input signals, others dedicated to output signals, and some other dedicated to ground. For example, electrodes 305A and 315B may be designated to receive input signals, electrodes 305C and 315D designated to provide output signals, and 315A, 305B, 315C and 305D tied to ground. Because the signals associated with adjacent sub-resonators have opposite polarity, the direction of the electric field lines is opposite in adjacent sub-resonators as shown in FIG. 3. Different electrode configurations may create different coupling between the sub-resonators. The sub-resonator coupling may also enhance the overall equivalent $k_t^2$ of the entire resonator.

Figure 4:
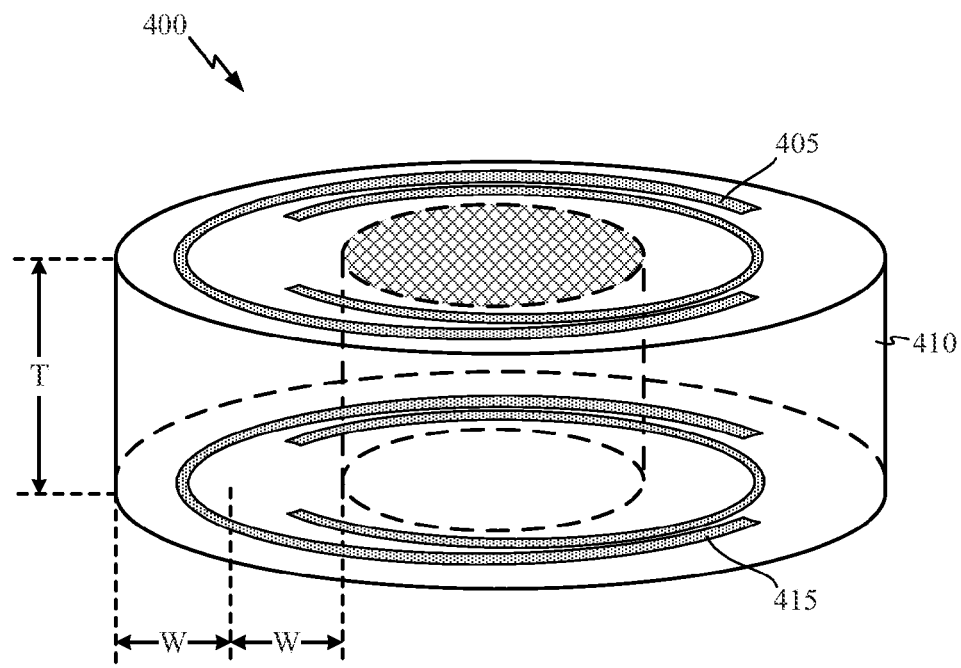
FIG. 4 is a diagram showing an exemplary piezoelectric resonator having a hollow disk shape.

FIG. 4 is a diagram showing an exemplary piezoelectric resonator 400 having a hollow disk shape. In this embodiment, piezoelectric resonator 400 may include a piezoelectric substrate 410 which is a hollow disk. The width of each of the circular sub-resonator (formed by circular electrodes on the piezoelectric substrate) may be W, so the entire thickness of the solid portion would approximately be N×W, where N is the number of sub-resonators (e.g., in FIG. 4, the number of sub-resonators N is 2). The thickness of the disk is T as seen in FIG. 4. A first set of electrodes 405 may be coupled to a first side of the piezoelectric substrate. A second set of electrodes 415 may be coupled to a second side, which is parallel to the first side. The operation of piezoelectric resonator 400 is similar to the piezoelectric resonator 200 shown in FIG. 2, as the length dimension of the piezoelectric resonator 200 is essentially "wrapped into a circle" in the embodiment shown in FIG. 4. The width and thickness dimensions are essentially the same in that the ratio T/W may lie in the range between 0.75 and 1.25, and, for example, may be equal to one (1).

Figure 5:
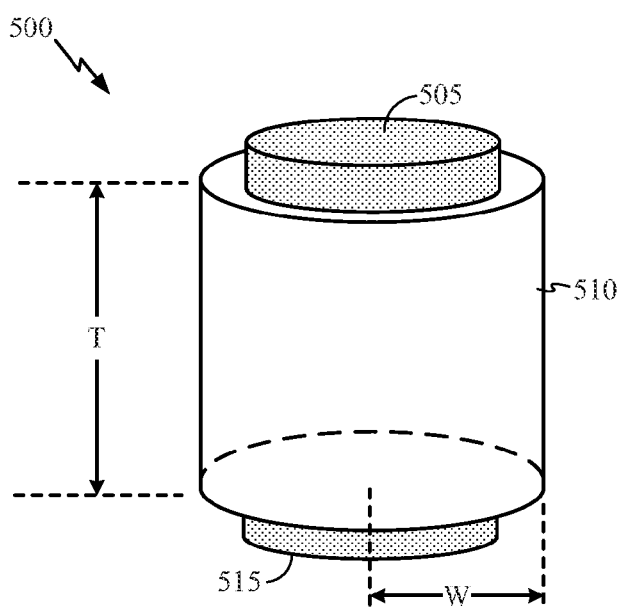
FIG. 5 is a diagram showing an exemplary piezoelectric resonator having a cylindrical shape.

FIG. 5 is a diagram showing an exemplary piezoelectric resonator 500 having a cylindrical shape. In this embodiment, piezoelectric resonator 500 may include a piezoelectric substrate 510 which is a solid cylinder. The thickness of the cylinder is T, and the width of the cylinder is W and is also the radius of the circular surface as shown in FIG. 5. A first electrode 505, which may be shaped as a disk, may be coupled to a first circular side of the piezoelectric substrate 510. A second electrode 515, may also be shaped as a disk, and may be coupled to a second circular side of the piezoelectric substrate 510, which is parallel to the first circular side. In this case, the radius (W) of the top (bottom) circular surface determines the frequency of lateral vibration. The thickness (T) determines the frequency of vertical vibration. The width and thickness dimensions may be configured so that the ratio T/W lies in the range between 0.75 and 1.25, and, for example, may be equal to one. When the T/W ratio is approximately equal to 1, the effective electromagnetic coupling $k_t^2$ may be improved as described above in the description of the embodiment shown in FIG. 2.

Figure 8:
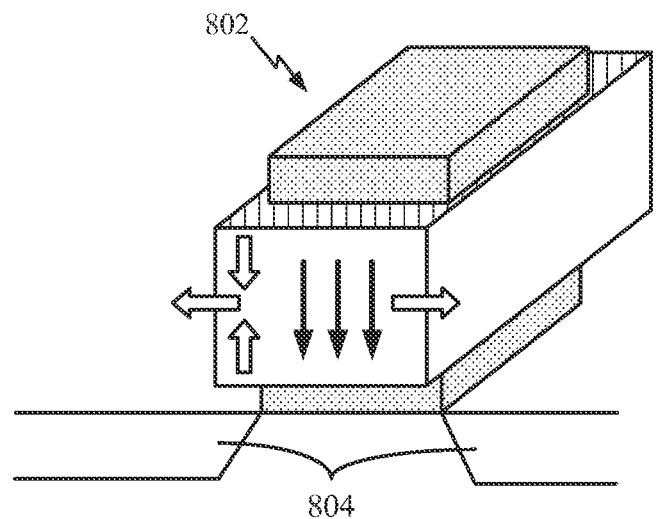
FIG. 8 is a diagram of an exemplary piezoelectric resonator integrated in at least one semiconductor die.

FIG. 8 is a diagram of an exemplary piezoelectric resonator 802 integrated in at least one semiconductor die 804. For example, piezoelectric resonator 802 may be one of single piezoelectric resonator 200, multi-finger piezoelectric resonator 300, piezoelectric resonator 400 having the hollow disk shape, and piezoelectric resonator 500 having the cylindrical shape.

Figure 6:
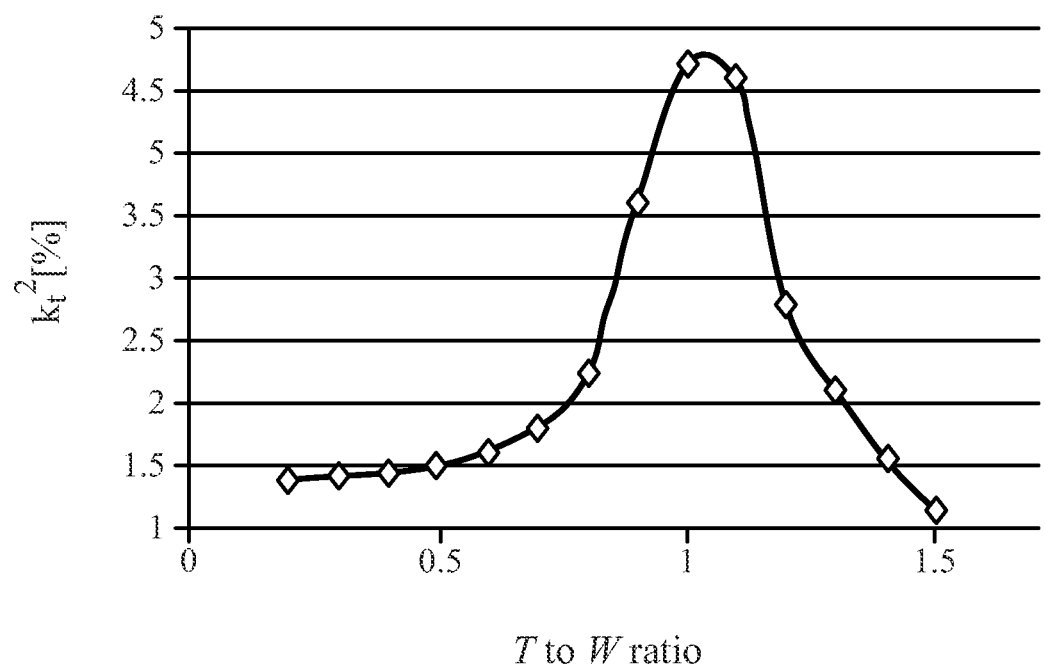
FIG. 6 shows a plot of the relationship between the electromagnetic coupling $k_t^2$ and the thickness to width ratio (T/W).

FIG. 6 shows a plot of an exemplary relationship between the electromechanical coupling $k_t^2$ and the thickness to width ratio (T/W). FIG. 6 illustrates the results of a simulation, which predicts that the maximum electromechanical coupling $k_t^2$ may occur when T/W=1. In this case, the width vibrational mode and the thickness vibrational mode may coherently combine to produce the peak shown in FIG. 6. However, gains may be made in electromechanical coupling $k_t^2$ when the T/W ratio lies in the range 0.75 to 1.25.

Figure 7:
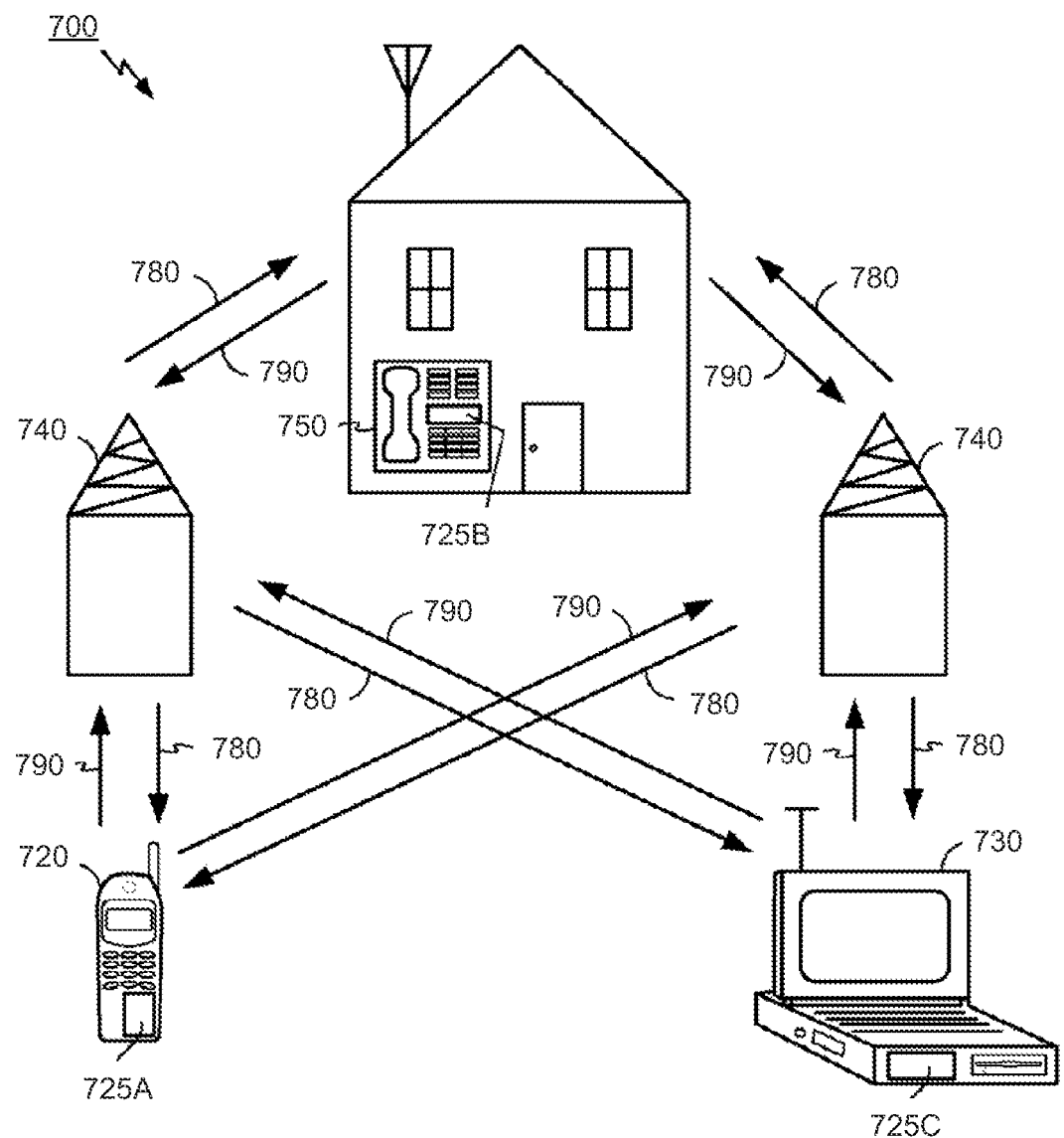
FIG. 7 is a diagram which depicts an embodiment where a piezoelectric resonator is incorporated into a remote unit.

FIG. 7 is a diagram showing an exemplary wireless communication system 700 in which embodiments of the disclosure may be employed. For purposes of illustration, FIG. 7 shows three remote units 720, 730, and 750 and two base stations 740. It is noted that conventional wireless communications systems can have many more remote units and base stations. The remote units 720, 730 and 750 may include piezoelectric resonators 725A, 725B and 725C, which may be an embodiment of the disclosure as discussed above. FIG. 7 further shows forward link signals 780 from the base stations 740 to the remote units 720, 730, and 750 and reverse link signals 790 from the remote units 720, 730 and 750 to the base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 7 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization. Embodiments of the disclosure may be suitably employed in any device which includes active integrated circuitry including memory and on-chip circuitry for test and characterization. The piezoelectric resonators described herein may be used as in a variety of applications, such as, for example, frequency sources for clocks, local oscillators, resonator filters, resonant sensors, duplexers, etc.

The foregoing disclosed devices and methods may be designed and configured into GDSII and GERBER computer files, which can be stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A piezoelectric resonator, comprising:
a piezoelectric; substrate forming a plurality of sub-resonators;
a plurality of first electrodes coupled to a first surface of the piezoelectric substrate, wherein each of the plurality of sub-resonators has a corresponding one of the plurality of first electrodes; and
a plurality of second electrodes coupled to a second surface of the piezoelectric substrate, wherein the each of the plurality of sub-resonators has a corresponding one of the plurality of second electrodes,
wherein the first surface and the second surface are substantially parallel and define a thickness dimension of the piezoelectric substrate,
wherein the each of the plurality of sub-resonators is defined by a width dimension,
wherein the piezoelectric substrate is configured to produce a resonance from a coherent combination of a thickness vibrational mode and a width vibrational mode when an excitation signal is applied to a first set of electrodes selected from at least one of the plurality of first electrodes or the plurality of second electrodes,
wherein a second set of electrodes selected from the at least one of the plurality of first electrodes or the plurality of second electrodes is set to ground, each electrode of the second set of electrodes diagonally opposed to another electrode of the second set of electrodes, and
wherein a ratio of the thickness dimension to the width dimension lies within a range between 0.75 and 1.25.

2. The piezoelectric resonator according to claim 1, wherein the ratio of the thickness dimension to the width dimension is approximately equal to one.

3. The piezoelectric resonator according to claim 1, wherein:
an input port is formed from:
a third set of electrodes selected from non-adjacent electrodes from the plurality of first electrodes, and
a fourth set of electrodes selected from non-adjacent electrodes from the plurality of second electrodes that are in the second set of electrodes, wherein the third set of electrodes and the fourth set of electrodes are diametrically opposed; and
an output port is formed from:
a fifth set of electrodes selected from non-adjacent electrodes from the plurality of second electrodes, and
a sixth set of electrodes selected from non-adjacent electrodes from the plurality of first electrodes that are in the second set of electrodes, wherein the fifth set of electrodes and the sixth set of electrodes are diametrically opposed.

4. The piezoelectric resonator according to claim 1, wherein:
a first port is formed from a positive input terminal selected from the plurality of first electrodes and a first ground terminal selected from the plurality of second electrodes, wherein the positive input terminal and the first ground terminal are diametrically opposed;
a second port is formed from a negative input terminal selected from the plurality of first electrodes and a second ground terminal selected from the plurality of second electrodes, wherein the negative input terminal and the second ground terminal are diametrically opposed;
a third port is formed from a positive output terminal selected from the plurality of first electrodes and a third ground terminal selected from the plurality of second electrodes, wherein the positive output terminal and the third ground terminal are diametrically opposed; and a fourth port is formed from a negative output terminal selected from the plurality of first electrodes and a fourth ground terminal selected from the plurality of second electrodes, wherein the negative output terminal and the fourth ground terminal are diametrically opposed.

5. The piezoelectric resonator according to claim 1, wherein the excitation signal is a plurality of excitation signals such that the excitation signals applied to adjacent sub-resonators have opposite polarity.

6. The piezoelectric resonator according to claim 1, wherein a shape of the piezoelectric resonator is one of a rectangular prism, a hollow cylinder, or a disk.

7. The piezoelectric resonator according to claim 1, wherein the piezoelectric substrate is formed from one of Aluminum Nitride, PZT, Lithium Niobate, Lithium Tantalate, or Zinc Oxide.

8. The piezoelectric resonator according to claim 1 integrated in at least one semiconductor die.

9. The piezoelectric resonator according to claim 1, integrated in an electronic device selected from the group consisting of a set top box, music player, video player, entertainment unit, navigation device, communications device, personal digital assistant (PDA), fixed location data unit, and a computer.

10. A method for generating an oscillating signal in a piezoelectric resonator, comprising:

receiving an electric signal at a set of electrodes disposed across a piezoelectric element such that at least two diagonally opposed electrodes of the set of electrodes are set to ground;

establishing a first vibrational mode in a thickness dimension of the piezoelectric element;

establishing a second vibrational mode in a width dimension of the piezoelectric element; and combining coherently the first vibration mode and the second vibration mode to produce a resonant vibration which increases a coefficient of electromechanical coupling ($k_t^2$) beyond a width-only vibration mode while providing single-chip multiple frequency capability.

11. The method according to claim 10, wherein the piezoelectric resonator is integrated in an electronic device selected from the group consisting of a set top box, music player, video player, entertainment unit, navigation device, communications device, personal digital assistant (PDA), fixed location data unit, and a computer.

12. A piezoelectric resonator, comprising:

means for receiving an electric signal at a set of electrodes disposed across a piezoelectric element such that at least two diagonally opposed electrodes of the set of electrodes are set to ground;

means for establishing a first vibrational mode in a width direction;

means for establishing a second vibrational mode in a thickness direction; and means for combining the first vibration mode and the second vibration mode to produce a resonant vibration which increases a coefficient of electromechanical coupling ($k_t^2$) beyond a width-only vibration mode.

13. A piezoelectric resonator, comprising:

a piezoelectric object having two points on a first surface diametrically opposed to two points on a second surface and configured to have a first point of the two points on the first surface and a first point of the two points on the second surface set to ground and to produce resonations in a vertical direction and resonations in a lateral direction, wherein the first point of the two points on the first surface is diagonally opposed to the first point of the two points on the second surface and the resonations in the vertical direction and the resonations in the lateral direction are combined to generate electrical signals, wherein a ratio of a thickness dimension and a width dimension is approximately equal to 1.

14. The piezoelectric resonator of claim 13, wherein a frequency of resonations in the vertical direction is based on the thickness dimension, and a frequency of resonations in the lateral direction is based on the width dimension.

15. The piezoelectric resonator of claim 13, wherein an effective coefficient of electromechanical coupling is based on a sum of electromechanical couplings of the resonations in the vertical direction and the resonations in the lateral direction.

16. The piezoelectric resonator of claim 13, further comprising a top electrode and bottom electrode such that an electric field is established between the top electrode and the bottom electrode.

17. The piezoelectric resonator of claim 13 further comprising top electrodes and bottom electrodes such that an electric field is established between the top electrodes and the bottom electrodes.

18. The piezoelectric resonator of claim 13, wherein a frequency of the electrical signal is a function of the width dimension.

\* \* \* \* \*